United States Patent
Lin et al.

(10) Patent No.: US 11,706,060 B2
(45) Date of Patent: *Jul. 18, 2023

(54) SERIAL-LINK RECEIVER USING TIME-INTERLEAVED DISCRETE TIME GAIN

(71) Applicant: Rambus Inc., San Jose, CA (US)

(72) Inventors: Haidang Lin, Sunnyvale, CA (US); Charles Walter Boecker, Ames, IA (US); Masum Hossain, Edmonton (CA)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/460,774

(22) Filed: Aug. 30, 2021

(65) Prior Publication Data

US 2022/0045885 A1     Feb. 10, 2022

Related U.S. Application Data

(63) Continuation of application No. 17/045,769, filed as application No. PCT/US2019/023913 on Mar. 25, 2019, now Pat. No. 11,128,499.

(Continued)

(51) Int. Cl.
*H03F 3/45*     (2006.01)
*H04L 25/03*     (2006.01)
(Continued)

(52) U.S. Cl.
CPC .. *H04L 25/03878* (2013.01); *H04L 25/03267* (2013.01); *H04L 25/03847* (2013.01);
(Continued)

(58) Field of Classification Search
CPC ......... H01L 21/31116; H01L 21/31144; H01L 21/67069; H01L 21/6833; H01L 21/76805;
(Continued)

(56) References Cited

U.S. PATENT DOCUMENTS 6,529,237 B1    3/2003    Tsay et al.
6,768,374 B1    7/2004    Lee
(Continued)

FOREIGN PATENT DOCUMENTS

WO    WO-2017-066251 A1    4/2017

OTHER PUBLICATIONS

Choi, Jong-Sang et al., "Continuous Time Linear Equalizer: A 0.18um CMOS 3.5-Gb/s Continuous-Time Adaptive Cable Equalizer Using Enhanced Low-Frequency Gain Control Method", IEEE Journal of Solid-State Circuits, Mar. 2013. 14 pages.

(Continued)

*Primary Examiner* — Eva Y Puente
(74) *Attorney, Agent, or Firm* — Silicon Edge Law Group LLP; Arthur J. Behiel

(57) ABSTRACT

A serial receiver combines continuous-time equalization, analog interleaving, and discrete-time gain for rapid, efficient data reception and quantization of a serial, continuous-time signal. A continuous-time equalizer equalizes a received signal. A number N of time-interleaved analog samplers sample the equalized continuous-time signal to provide N streams of analog samples transitioning at rate reduced by 1/N relative to the received signal. A set of N discrete-time variable-gain amplifiers amplify respective streams of analog samples. A quantizer then quantizes the amplified streams of analog samples to produce a digital signal.

20 Claims, 1 Drawing Sheet

Related U.S. Application Data

(60) Provisional application No. 62/727,365, filed on Sep. 5, 2018, provisional application No. 62/659,456, filed on Apr. 18, 2018.

(51) Int. Cl.
*H04L 25/49* (2006.01)
*H03K 5/15* (2006.01)

(52) U.S. Cl.
CPC ...... *H04L 25/4927* (2013.01); *H03F 3/45183* (2013.01); *H03K 5/15013* (2013.01); *H04L 2025/03535* (2013.01)

(58) Field of Classification Search
CPC ....... H01L 21/76897; H01L 29/66795; H04W 52/20; H04W 52/225; H03F 3/005; H03F 3/16; H03F 2200/156; H03F 2200/159; H03F 2200/357; H03F 2200/42; H03F 3/62; H03F 3/70
USPC .......................................................... 375/229
See application file for complete search history.

(56) References Cited

U.S. PATENT DOCUMENTS

| | | | |
|---|---|---|---|
| 7,889,006 B1 | 2/2011 | Jones | |
| 2003/0174023 A1 | 9/2003 | Miyasita | |
| 2005/0195894 A1 | 9/2005 | Kim et al. | |
| 2006/0132191 A1 | 6/2006 | Palmer | |
| 2008/0094269 A1 | 4/2008 | Bult et al. | |
| 2009/0115523 A1* | 5/2009 | Akizuki | H03F 3/45946 330/253 |
| 2010/0167685 A1* | 7/2010 | Burke | H04B 1/28 455/341 |
| 2010/0329325 A1 | 12/2010 | Mobin et al. | |
| 2011/0228823 A1 | 9/2011 | Lutz et al. | |
| 2011/0316600 A1 | 12/2011 | Lin | |
| 2012/0076181 A1 | 3/2012 | Aziz et al. | |
| 2014/0152357 A1 | 6/2014 | Zerbe et al. | |
| 2014/0266845 A1* | 9/2014 | Lee | H03F 3/70 330/277 |
| 2015/0326198 A1 | 11/2015 | Street | |
| 2017/0230209 A1* | 8/2017 | Ding | H04L 25/03878 |
| 2017/0295039 A1 | 10/2017 | Hidaka | |
| 2017/0346662 A1* | 11/2017 | Beukema | H04L 25/03019 |

OTHER PUBLICATIONS

David, Jeremie, "Modern High-Speed Link Design", Electrical Engineering and Computer Sciences, University of California at Berkeley, Technical Report No. UCB/EECS-2017-69, http://www2.eecs.berkeley.edu/Pubs/TechRpts/2017/EECS-2017-69.html, May 11, 2017. 30 pages.

Lauwsma, S.M. et al., "Time-Interleaved Analog-to-Digital Converters, Chapter 2 Time-Interleaved Track and Holds", Analog Circuits and Signal Processing, DOI 10.1007/978-90-481-9716-3_2, Springer Science+Business Media B.V., 2011, pp. 5-38. 35 Pages.

Manganaro, Gabriele, et al., "Interleaving ADCs: Unraveling the Mysteries", Analog Dialogue 49-07, Jul. 2015, analog.com/analogdialogue, pp. 1-5. 5 pages.

Notification of Transmittal of the International Search Report and the Written Opinion of the International Searching Authority, or the Declaration dated Jul. 1, 2019 re: Int'l Appln. No. PCT/US19/023913. 11 Pages.

Palermo, Samuel, "ADC-Based Serial Links: Design and Analysis", Texas A&M University, ISSCC Tutorial, San Francisco, CA, Feb. 11, 2018. 21 pages.

Wikipedia, "Analog Front-End", https://en.wikipediaorg/w/index.php?title-Analog_front-end&oldid=755832767, Dec. 20, 2016, 1 page.

Wikipedia, "Linear Circuit", https://en.wikipedia.org/w/index.php?title=Linear_circuit&oldid=849101068., Jul. 6, 2018. 2 pages.

Wikipedia, "Wired Communication", https://en.wikipedia.org/w/index.php?title=Wired_communication&oldid=843002115. May 26, 2018. 1 page.

\* cited by examiner

US 11,706,060 B2

SERIAL-LINK RECEIVER USING TIME-INTERLEAVED DISCRETE TIME GAIN

BACKGROUND

Wired communication refers to the transmission of data over a wire-based communication technology. Receiving such data, particularly at high data rates, requires sensitive, linear analog amplifiers. An amplifier is linear if its output is a linear function of its input, which means in part that signal components of different frequencies receive the same level of amplification. Linearity is difficult to obtain in practice and is a main factor limiting the speed performance of analog receivers.

BRIEF DESCRIPTION OF THE DRAWINGS

The detailed description is illustrated by way of example, and not by way of limitation, in the figures of the accompanying drawings and in which like reference numerals refer to similar elements and in which.

DETAILED DESCRIPTION

Figure 1:
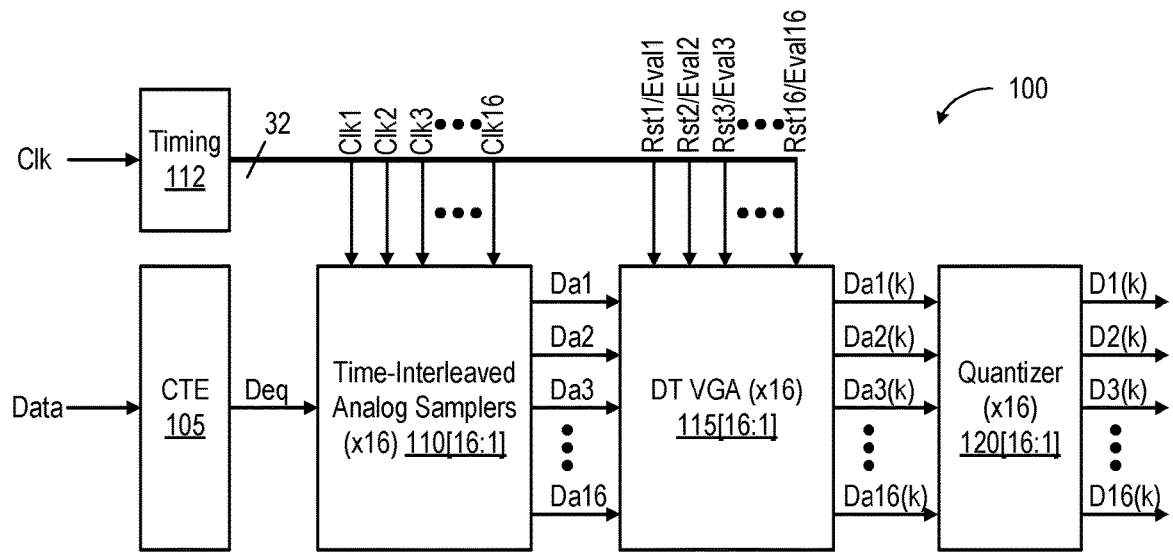
FIG. 1 depicts a serial receiver 100 that uses a combination of time-interleaving and discrete-time gain for rapid, efficient data reception and quantization of a serial, continuous-time signal Data on a like-identified single-ended or differential input node.

FIG. 1 depicts a serial receiver 100 that uses a combination of continuous-time equalization, analog interleaving, and discrete-time gain for rapid, efficient data reception and quantization of a serial, continuous-time input signal Data on a like-identified single-ended or differential input node. Signal Data is conveyed at a relatively high symbol rate, 56 GBd (56 billion symbols per second) as of this writing. A continuous-time equalizer 105 equalizes signal Data to provide an equalized continuous-time signal Deq that operates at the same symbol rate. In this context, a "continuous-time" signal is one that is continuous in time, and a "continuous-time" equalizer is one that is also continuous in time, e.g. it does not use any clocking and operates over a range of frequencies. Suitable continuous-time equalizers are well known to those of skill in the art so a detailed discussion is omitted.

A set of sixteen time-interleaved analog samplers 110[16:1] samples equalized continuous-time signal Deq using sixteen differently phased clock signals Clk1 through Clk16 to obtain sixteen respective series of analog samples Da1 through Da16. Timing circuitry 112 derives clock signals Clk1 through Clk16 from a reference clock signal Clk synchronized to signal Data. Each analog sample expressed in series Da1 through Da16 is a voltage level corresponding to one symbol time of equalized continuous-time signal Deq. Time interleaving samplers 110[16:1] reduces the sample rate by a factor of sixteen, and thus relaxes time constraints on downstream circuitry and increases overall gain bandwidth. In this embodiment in which signal Data is conveyed at 56 GBd, for example, analog sample streams Da1 through Da16 are each conveyed at about 3.5 GBd. The number of time-interleaved analog samplers can be generalized to N, which may be more or fewer than sixteen in other embodiments. Analog samplers, such as so-called "track-and-hold amplifiers," are well known to those of skill in the art.

Each of the sixteen time-interleaved analog samplers 110[16:1] feeds a corresponding one of sixteen discrete-time variable-gain amplifiers 115[16:1]. Amplification through discrete-time variable-gain amplifiers 115[16:1] is linear relative to continuous-time variable-gain amplifiers and contributes to the overall linearity of receiver 100. Considering equalized, continuous-time signal Da1, for example, one of discrete-time variable-gain amplifiers 115[16:1] provides linear amplification of that series of analog symbols to produce an amplified series of analog samples Da1(k). Timing circuitry 112 controls the timing of discrete-time variable-gain amplifiers 115[16:1] by issuing sixteen sets of reset and evaluation signals Rst #/Eval #, examples of which are detailed below in connection with FIGS. 2A and 2B. The remaining fifteen amplifiers 115[16:1] similarly amplify signals Da2-Da16 to produce amplified series of analog samples Da2(k) through Da16(k). In general, a signal xn(k) represents a sample from the nth instance of n=16:0 constituent amplifier 115[16:1] at a discrete time k. The voltage gain provided by discrete-time variable-gain amplifiers 115[16:1] in the discrete-time domain reduces the need for continuous-time amplification at earlier stages. Reduced continuous-time amplification allows CTE 105 and analog samplers 110[16:1] to operate at lower voltage levels, and thus in more linear amplification ranges. Finally, a set of sixteen conventional quantizers 120[16:1] coupled to the outputs of discrete-time variable-gain amplifiers 115[16:1] quantizes analog, discrete-time signals Da1(k) through Da16(k) to produce sixteen series of digital signals D1(k)-D16(k) that collectively convey the digital values represented by the original received continuous-time signal Data.

Figures 2A, 2B:
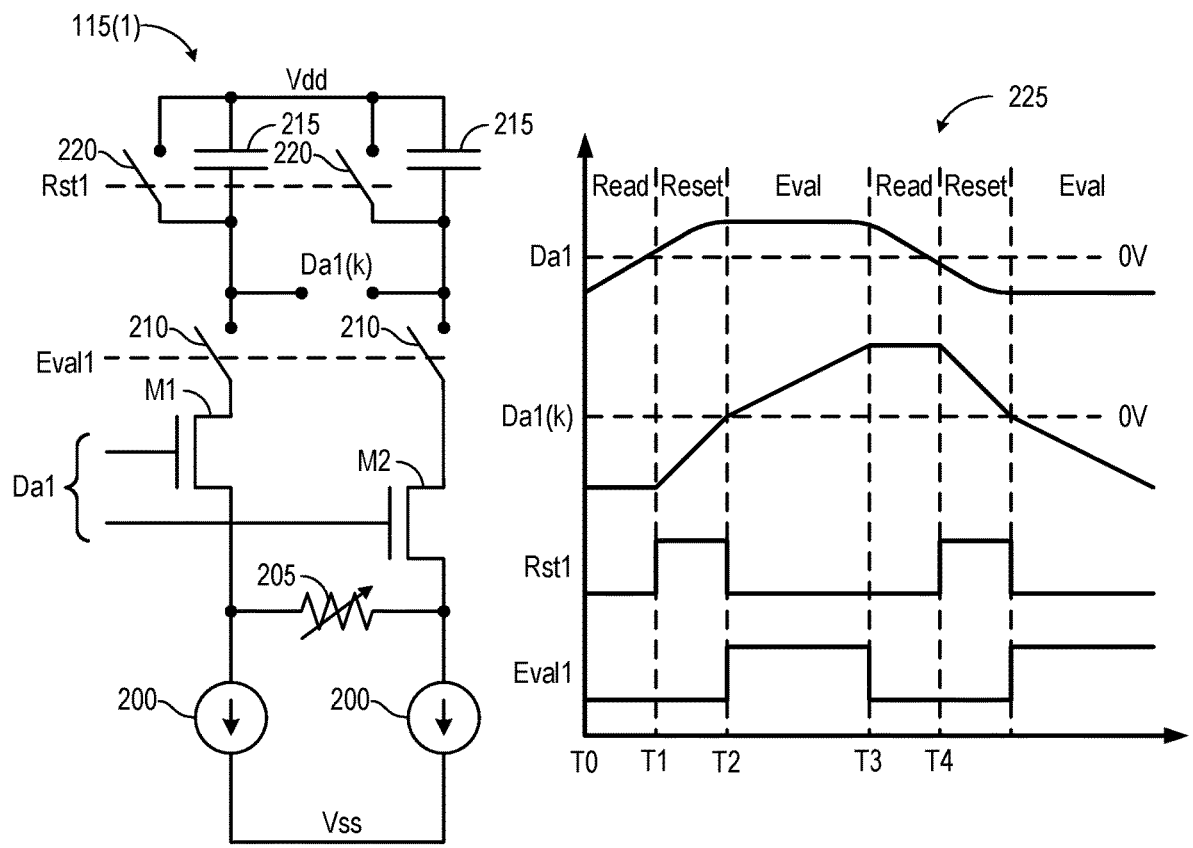
FIG. 2A details an embodiment of discrete-time variable-gain amplifier 115(1), one of sixteen such amplifiers 115[16:1] introduced in FIG. 1.
FIG. 2B is a timing diagram 225 illustrating the operation of discrete-time variable-gain amplifier 115(1) of FIG. 2A.

FIG. 2A details an embodiment of discrete-time variable-gain amplifier 115(1), one of sixteen such amplifiers 115[16:1] introduced in FIG. 1. Amplifier 115(1) is a differential amplifier with a gain stage that employs a pair of NMOS transistors M1 and M2 with control terminals (gates) connected to complementary input nodes to receive differential analog signal Da1. The sources (current-handling terminals) of transistors M1 and M2 are coupled to a lower power-supply terminal Vss via respective current sources 200 and to one another via a variable resistance 205. The drains (also current-handling terminals) of transistors M1 and M2 are selectively coupled to complementary output nodes Da1(k) via ganged switching elements 210, both controlled by evaluation signal Eval1, which can be of transistors (not shown). Output nodes Da1(k) are also coupled to upper power-supply terminal Vdd via a pair of capacitors 215 and ganged switching elements 220 that selectively discharge capacitors 215 responsive to reset signal Rst1.

FIG. 2B is a timing diagram 225 illustrating the operation of discrete-time variable-gain amplifier 115(1) of FIG. 2A. The trace for signal Da1 represents the analog voltage difference between the gates of transistors M1 and M2, which voltage difference can be positive or negative depending upon the value expressed by the symbol under consideration. The trace for signal Da1(k) represents the positive or negative voltage difference between differential output nodes Da1(k).

Signals Rst1 and Eval1, both digital, are low from time T0 to T1 to open switching elements 210 and 220. Output nodes Da1(k) thus float at voltages that are a function of a prior symbol. Reset signal Rst1 is asserted at time T1 to close switching elements 220 to discharge capacitors 215. Both nodes Da1(k) are thus set to the high supply voltage Vdd and their differential value to zero. An evaluation stage begins at time T2 when reset signal Rst1 returns low and evaluation signal Eval1 is asserted. Switching elements 220 open and switching elements 210 close. The relative voltages across capacitors 220 thus change as a function of the currents through transistors M1 and M2, and thus the differential voltage across the gates of transistors M1 and M2. The voltage across each capacitor 215, and thus across output nodes Da1(k), changes linearly responsive to the constant currents pulled by current sources 200. Beginning evaluation with output nodes Da1(k) at supply voltage Vdd maximizes signal headroom and amplitude to further contribute to linearity. Source degeneration established by resistor 205 also contributes by reducing the impact of the input transconductances of transistors M1 and M2 on the gain of amplifier 115(1). Resistance 205 can be tuned to establish a desired level of source degeneration and to match and calibrate amplifier 115(1) with respect to the other variable-gain amplifiers 115[16:2].

The evaluation stage ends at time T3 when evaluation signal Eval1 is deasserted, leaving a measure of symbol magnitude stored as a voltage across nodes Da1(k). Quantizer 120(1) quantizes the analog value of signal Da1(k) between times T3 and T4 to produce a digital value D1(k) (FIG. 1). Reset signal Rst1 is once again asserted in anticipation of the next symbol. Each of the reset and read stages takes about 25% of one symbol time in this example, leaving 50% for evaluation.

Input signal Data is a PAM-4 signal (for pulse-amplitude modulation, 4-level) in the example of FIG. 1. That is, signal Data is modulated using four pulse amplitudes to represent symbols, each symbol conveying two binary bits (i.e., 00, 01, 10, and 11). Quantizer 120[16:1] quantizes each analog level—each symbol—of sixteen 3.5 GBd series Da[16:1](k) into two bits for a total data rate of 112 Gb/s (3.5 GBd*16*2 bits=112 Gb/s). Binary or other modulation schemes can be used in other embodiments.

In the foregoing description and in the accompanying drawings, specific terminology and drawing symbols have been set forth to provide a thorough understanding. In some instances, the terminology and symbols may imply specific details that are not required. The term "coupled," for example, is used herein to express a direct connection as well as a connection through one or more intervening circuits or structures. Furthermore, while the subject matter has been described in connection with specific embodiments, other embodiments are also envisioned. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A receiver comprising:
   N analog samplers each coupled to a common node to sample a continuous-time signal conveyed at a symbol rate, thereby providing N series of analog samples each conveyed at a sample rate lower than the symbol rate; and
   for each of the N analog samplers:
      a discrete-time amplifier coupled to an output of the analog sampler to amplify the respective series of analog samples, thereby providing an amplified series of analog samples; and
      a quantizer coupled to an output of the discrete-time amplifier to quantize the respective amplified series of analog samples.

2. The receiver of claim 1, each of the discrete-time amplifiers including:
   a transistor having:
      a control terminal coupled to the output of the analog sampler;
      a first current-handling terminal; and
      a second current-handling terminal; and
   a first switching element to selectively connect the first current-handling terminal to the quantizer.

3. The receiver of claim 2, each of the discrete-time amplifiers further including a capacitor connected between the switching element and a power-supply terminal.

4. The receiver of claim 3, each of the discrete-time amplifiers further including a second switching element connected in parallel with the capacitor, the second switching element to selectively discharge the capacitor.

5. The receiver of claim 4, further comprising timing circuitry coupled to the discrete-time amplifier, the timing circuitry to control the first switching element to charge the capacitor responsive to each of the analog samples.

6. The receiver of claim 5, the timing circuitry to control the second switching element to discharge the capacitor between the analog samples.

7. The receiver of claim 6, the second switching element to discharge the capacitor to zero volts.

8. The receiver of claim 2, each of the discrete-time amplifiers further including a current source coupled between the second current-handling terminal and a power-supply terminal.

9. The receiver of claim 8, further comprising a second current source coupled between the second current-handing terminal and the power-supply terminal, the receiver further comprising an impedance disposed between the second current source and the second current-handling terminal.

10. The receiver of claim 9, wherein the impedance is programmable.

11. A method for quantizing a continuous-time signal, the method comprising:
   periodically sampling the continuous-time signal responsive to phase-offset clock signals, thereby providing multiple series of analog samples;
   amplifying each of the multiple series of analog samples to produce multiple amplified series of analog samples; and
   quantizing each of the multiple amplified series of analog samples.

12. The method of claim 11, wherein the periodically sampling comprises charging a capacitor responsive to the continuous-time signal.

13. The method of claim 12, further comprising discharging the capacitor between the series of analog samples.

14. The method of claim 13, wherein the discharging of the capacitor sets a voltage across the capacitor to zero.

15. The method of claim 12, wherein the charging of the capacitor comprises drawing a constant current through the capacitor.

16. The method of claim 11, wherein the continuous-time signal comprises complementary signal halves.

17. The method of claim 11, wherein quantizing each of the multiple amplified series of analog samples comprises quantizing each analog sample in each of the multiple amplified series of analog samples.

18. The method of claim 17, wherein the quantizing produces two binary bits for each of the analog sample in each of the multiple amplified series of analog samples.

19. A receiver comprising:
differential analog samplers to sample a continuous-time signal conveyed at a symbol rate, thereby providing multiple series of analog samples, each of the multiple series of analog samples conveyed at a sample rate lower than the symbol rate; and
for each of the analog samplers, a discrete-time amplifier coupled to an output of the analog sampler to amplify the respective series of analog samples, thereby providing an amplified series of analog samples.

20. The receiver of claim 19, further comprising a quantizer coupled to an output of the discrete-time amplifier to quantize the respective amplified series of analog samples.

\* \* \* \* \*